US006211034B1

United States Patent
Visokay et al.

(10) Patent No.: US 6,211,034 B1
(45) Date of Patent: *Apr. 3, 2001

(54) METAL PATTERNING WITH ADHESIVE HARDMASK LAYER

(75) Inventors: Mark R. Visokay; Luigi Colombo, both of Dallas, TX (US); Paul McIntyre, San Jose, CA (US); Scott R. Summerfelt, Dallas, TX (US)

(73) Assignee: Texas Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/059,546

(22) Filed: Apr. 13, 1998

Related U.S. Application Data

(60) Provisional application No. 60/043,688, filed on Apr. 14, 1997.

(51) Int. Cl.[7] .................................................. H01L 21/8242
(52) U.S. Cl. ........................ 438/396; 438/669; 438/671; 438/720
(58) Field of Search ................................... 438/671, 669, 438/720, 396, 240, FOR 220

(56) References Cited

U.S. PATENT DOCUMENTS

| 5,024,722 | 6/1991 | Cathey, Jr. . |
|---|---|---|
| 5,156,992 | 10/1992 | Teng et al. . |
| 5,173,442 | 12/1992 | Carey . |
| 5,264,076 | 11/1993 | Cuthbert et al. . |
| 5,302,547 | 4/1994 | Wojnarowski et al. . |
| 5,418,388 | 5/1995 | Okudaira et al. . |
| 5,468,342 | 11/1995 | Nulty et al. . |
| 5,530,279 | 6/1996 | Yamamichi et al. . |
| 5,562,801 | 10/1996 | Nulty . |
| 5,633,210 | * 4/1996 | Yang et al. . |
| 5,793,076 | * 9/1995 | Fazan et al. . |
| 5,930,639 | * 4/1996 | Schuele et al. . |

OTHER PUBLICATIONS

Ghandhi, Sorab K. VLSI Fabrication Principles (John Wiley & Sons, New York), Jan. 1983.*

Nishikawa, et al., "Platinum etching and plasma characteristics in RF magnetron and electron cyclotron Resonance plasmas," 32 Japanese J. Applied Physics Part 1 6102 (1993).

Mace, et al., "Reactive ion etching of Pt/PZT/Pt ferroelectric thin film capacitors in high density DECR Plasma," 29 Microelectronic Engineering 45 (1995).

Shoji, et al., "A 7.03 micron2 Vcc/2–plate nonvolatile DRAM cell with a Pt/PZT/Pt/TiN capacitor Patterned by one–mask dry etching," 1996 Symposium on VLSI Technology Digest 28 (1996).

(List continued on next page.)

*Primary Examiner*—George Fourson
*Assistant Examiner*—Barbara E. Abbott
(74) *Attorney, Agent, or Firm*—Wade James Brady, III; Frederick J. Telecky, Jr.

(57) ABSTRACT

An adherent hardmask structure and method of etching a bottom electrode in memory device capacitor structures that dispenses with the need for any adhesion promoter during the etching of the bottom electrode. By using silicon nitride as a hardmask 220, the processing is simplified and a more robust capacitor structure can be produced. Silicon nitride 220 has been shown to yield significantly enhanced adhesion to platinum 210, as compared to silicon oxide formed by any method. Since silicon nitride 220 is oxidation resistant, it advantageously resists any oxygen plasma that might be used in the etch chemistry. This etching process can be used during processing of high-k capacitor structures in DRAMs in the $\geq 256$ Mbit generations.

12 Claims, 2 Drawing Sheets

OTHER PUBLICATIONS

Andrew G. Nagy, Anisotropic Organic Reactive Ion Etch Producing Minimal Sidewall Deposition, Motorola Technical Developments, vol. 6, Oct. 1986, Table of Contents and Page 13.

H. Koga, et al., A 0.23um2 Double Self–Aligned Contact Cell for Gigabit DRAMs With a Ge–Added Vertical Epitaxial Si Pad, IEDM 96–589–592.

A. Yuuki, et al., Novel Stacked Capacitor Technology for 1 Gbit DRAMs with CVD–(Ba,Sr) TiO3, Thin Films on a Thick Storage Node of Ru, IEDM 95–115–118.

Tung–Sheng Chen, et al., Ir–Electroded BST Thin Film Capacitors for 1Giga–bit DRAM Application, IEDM 96–679–682.

S. Yamamichi, et al., An ECR MOCVD (Ba,Sr) TiO3 based stacked capacitor technology with Ruo2/ Ru/TiN/TiSix storage nodes for Gbit–scale DRAMs, IEDM 95–119–122.

S. S. Roth, et al., Offset Trench Isolation, J. Electrochem Soc., vol. 141, No. 8, Aug. 1994, pp. 2178–2181.

* cited by examiner

METAL PATTERNING WITH ADHESIVE HARDMASK LAYER

This is a Non Provisional application filed under 35 USC 119(e) and claims priority prior provisional Ser. No. 60/043,688 inventor Visokay, et al., filed Apr. 14, 1997.

BACKGROUND AND SUMMARY OF THE INVENTION

The present invention relates to integrated circuit memory device structures and fabrication methods.

Background: DRAMs

Memory device capacitor structures for gigabit dynamic random access memory (DRAM) applications typically include a bottom storage electrode formed over a polysilicon plug within the interlevel dielectric layer (e.g. silicon dioxide). The polysilicon plug is in contact with an underlying transistor. A dielectric layer that has a high dielectric constant is usually deposited over the bottom storage electrode, which provides the increased capacitance that these structures exhibit. A top electrode, which can be of the same material as the bottom storage electrode, can then be deposited over the resulting stacked cell capacitor structures. Similar architectures can also be used for FRAM (ferroelectric random access memory) cells, if the dielectric is ferroelectric.

Background: High Dielectric Constant Materials

For future memory device capacitor structures, high-dielectric-constant materials such as barium strontium titanate (BST) or ferroelectric materials such as lead zirconium titanate (PZT) are leading candidates for the dielectric material. Such materials have extremely high dielectric constants (possibly greater than 1000). However, care must be taken to avoid formation of a native oxide on the electrode (or other native dielectric layer) which could degrade the benefit of the high-dielectric-constant (high-k) material. The effect of a native oxide would be to add a lower-value capacitor in series with the desired high-value DRAM capacitor, and this would greatly reduce the net capacitance between the plates.

Background: Bottom Electrode Materials

Promising candidates for bottom electrode materials include the eight noble metals (e.g. at least 50 percent atomic of any combination of the following: platinum, palladium, ruthenium, iridium, rhodium, osmium, gold, and silver), and their oxides (such as $RuO_2$, $IrO_2$, $Rh_2O_3$, $OsO_2$, and $PdO_2$). These eight metals (of which platinum is the most common) are all physically and chemically fairly similar, and all are quite stable (or form conductive oxides, so the capacitance is not degraded) in oxidizing, reducing, or inert atmospheres at high temperatures. In addition, these materials are resistant to hydrogen damage, and do not degrade the dielectric polarization after annealing at high temperatures.

A particularly important characteristic of DRAM electrode materials is the work function. (This number describes the energy required to remove one electron from the metal.) A dominant leakage mechanism in advanced DRAM cells is Schottky emission from the metal into the dielectric, so metals with a higher work function produce less leakage. Platinum has a notably high work function, and hence is particularly attractive for such applications, but the other noble metals, and their oxides, all have fairly high work functions as well.

Background: Storage Node Structures

In most storage node structures, the bottom electrode material will be in direct contact with silicon dioxide, which serves as the interlevel dielectric between the storage node and the underlying CMOS transistor. A schematic of a simple prior art cell structure, at an intermediate stage of fabrication, is shown in FIG. 3. A barrier layer 340, such as TiAlN, separates the polysilicon plug 330 formed in the interlevel dielectric material 320 (e.g. $SiO_2$) from the bottom electrode 300. A dielectric layer 310 (e.g. BST) is also shown covering the entire structure, including the bottom electrode 300. (In this figure the dielectric layer has not yet been etched, and the under-lying transistor and overlying top electrode are not shown.) The dielectric layer 310 is preferably deposited by chemical vapor deposition (CVD) under oxidizing conditions, but can alternatively be deposited by sputtering.

A lithographic process will typically be used to define the bottom electrode structure, which will have sub-quarter-micron geometries. However, the noble metals which are used in these capacitor structures are difficult to dry etch due to the lack of volatile reaction products.

In addition, a significant problem exists with using a photoresist mask during platinum etching because of the polymer redeposition onto the platinum structure being etched. Removal of this residue can be difficult. It has been found that adding oxygen to the etch chemistry can improve the platinum etching characteristics, but this could severely damage the photoresist during etching.

Moreover, etching these noble metals is difficult because they do not have volatile halogen species. Therefore, a chemically enhanced ion milling etch process is typically used. However, the etch selectivity between the platinum and the photoresist mask is poor, and therefore a thick photoresist mask must be used. In addition, the platinum redeposits onto the sidewalls of the photoresist during the etch process, which results in substantial growth of the feature size dimensions (e.g. approximately 0.5–1.0 times the platinum thickness). For small features, this is unacceptable. Furthermore, when the photoresist is removed, the redeposited platinum remains, which is extremely undesirable. In order to remove the redeposited platinum, a sloped photoresist must be used during the etch. However, a sloped photoresist produces a sloped platinum layer, which is also not desirable, especially for etching small features. Adding oxygen to the etch gas helps the selectivity of platinum to the underlying dielectric, but greatly degrades the selectivity of platinum to the photoresist.

Background: Silica Hardmasks

The use of a hardmask, such as silica ($SiO_2$), instead of a photoresist mask, is desirable for patterning DRAM capacitor electrodes since any residue that forms can be easily removed. However, noble metals adhere poorly to $SiO_2$, and therefore $SiO_2$ would not perform well as a hardmask for these materials without the use of an adhesion promoter. A thin layer of titanium is often used to promote adhesion between $SiO_2$ and metals, but introducing titanium into the electrode material is likely to result in degradation of the capacitor structure. Another conventional method of increasing the adhesion between metals and silica involves the use of thermal silicon oxide. However, while thermal oxide does yield moderate platinum adhesion, it cannot be used in hardmask applications since it is a grown, rather than deposited, material.

Adherent Hardmask Structures and Methods

The present application discloses a process for forming capacitors, which uses silicon nitride as a hardmask to pattern a noble metal electrode. Silicon nitride has been shown to yield improved platinum adhesion as compared to any kind of silicon oxide. The silicon nitride can be deposited by several methods, including low pressure chemical vapor deposition (LPCVD), plasma enhanced chemical vapor deposition (PECVD), or Jet Vapor Deposition. Since silicon nitride is oxidation resistant, it resists erosion by oxygen in the etch chemistry. Silicon nitride hardmasks have been previously used as an intermediate hardmask layer in tri-level photoresist processing applications and as a hardmask for patterning oxides and silicon in recessed variants of LOCOS isolation, but not for patterning metals. This etching process can advantageously be used during processing of high-k capacitor structures in DRAMs in the ≥256 Mbit generations.

Advantages of the disclosed methods and structures include:

Si3N4 dispenses with the need for any adhesion promoter, which both simplifies the processing and results in a more robust capacitor structure;

Si3N4 is a standard semiconductor material with well established properties and processing techniques;

Si3N4 has been shown to yield significantly better platinum adhesion than silicon oxide, and is expected to have similar adhesion characteristics for other materials such as palladium, ruthenium and iridium;

no extra surface treatment is needed to enhance adhesion to platinum;

Si3N4 fulfills the requirements of hardmask material; and

Si3N4 can also be used as an anti-reflection coating for deep UV lithography.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

First Hardmask Embodiment: Silicon Nitride

Figure 1:
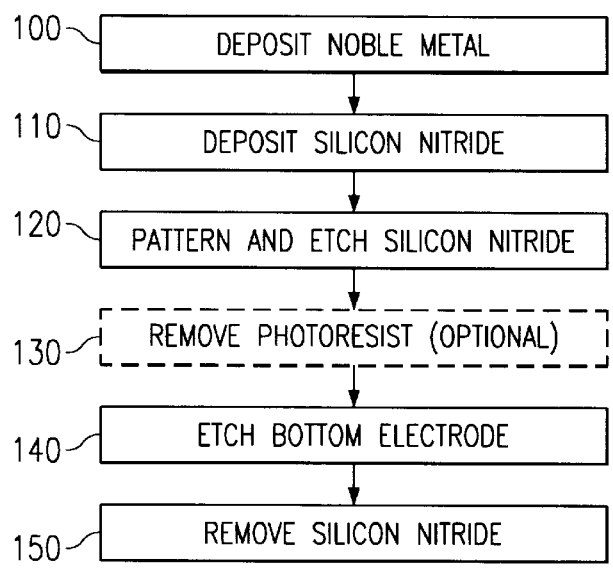
FIG. 1 shows a flow chart for etching the bottom electrode in memory device capacitor structures in accordance with preferred embodiments of the present invention.
Figure 2A:
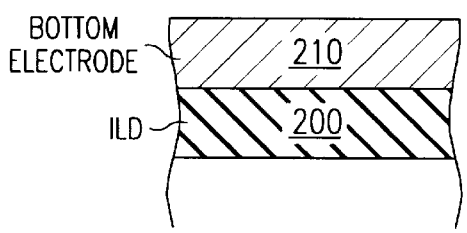
FIGS. 2A–2G schematically illustrate a sample embodiment of the disclosed etching process of the present invention.
Figure 2B:
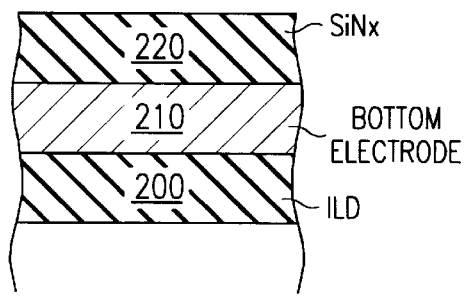

FIG. 1 shows a process flow for etching a metal layer using a hardmask, and FIGS. 2A–2G illustrate schematically one embodiment of the present invention. In FIG. 2A, a bottom electrode 210 having a thickness between 50 and 500 am (preferably 300 nm) is shown (step 100) overlying the interlevel dielectric layer 200, which has a thickness of approximately 400 nm (or 300 nm for thermal silicon oxide). (The underlying transistor and connection to it are conventional and not shown.) The bottom electrode can be deposited prior to or subsequent to any intervening layers (e.g. layers of titanium, and/or TiN) in the structure. Subsequently, a hardmask layer consisting of silicon nitride 220 (Si3N4) is deposited (step 110) over the bottom electrode 210 (and any intervening layers), as shown in FIG. 2B. The thickness of the hardmask layer is approximately 50 nm.

Figure 2C:
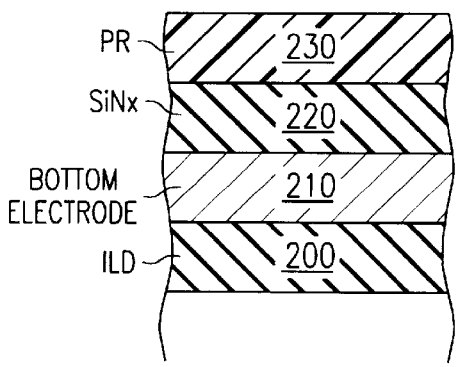
Figure 2D:
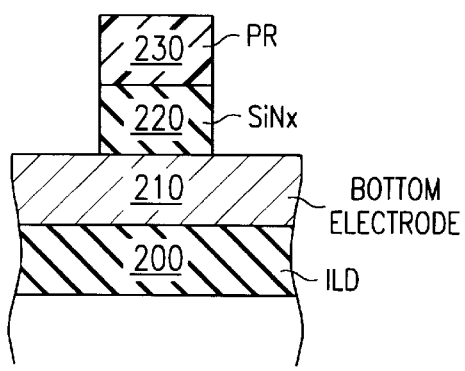
Figure 2E:
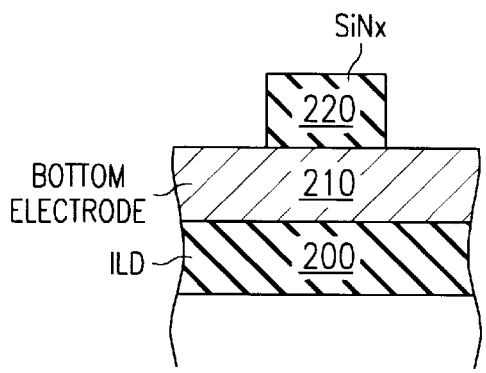

The entire structure is then coated with a photoresist 230, seen in FIG. 2C, which is used to pattern and etch the layer of silicon nitride 220 (step 120), using a conventional dry nitride etching process, in locations where the bottom electrode 210 is to be etched (step 140), shown in FIG. 2D. The photoresist 230 can then optionally and preferably be removed (step 130) by ashing, shown in FIG. 2E, to avoid the formation of a sloped sidewall during the subsequent bottom electrode etch (step 140).

Figure 2F:
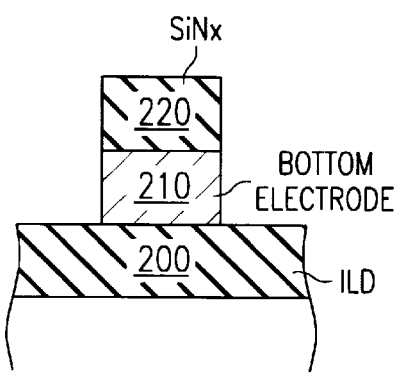
Figure 2G:
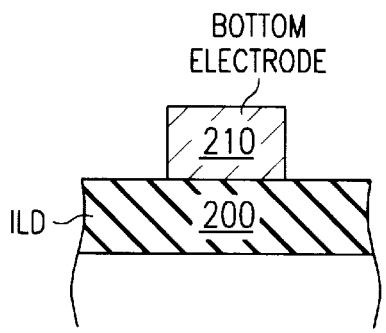
Figure 3:
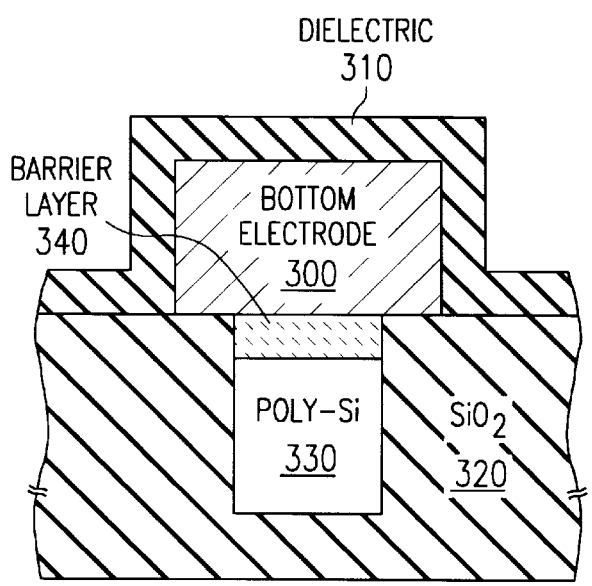
FIG. 3 is a cross-sectional diagram of a prior art capacitor cell structure.

The layer of silicon nitride 220 can then advantageously be used as a hardmask during the etching of the bottom electrode material 210 (step 140) in desired locations to form a storage node array, which is illustrated in FIG. 2F. Subsequently, the hardmask layer of silicon nitride 220 is removed (step 150) from the tops of the storage nodes, as can be seen in FIG. 2G. Silicon nitride 220 is advantageously oxidation resistant, which enables an oxygenenriched plasma source to be used during the etching of the bottom electrode 210 (step 140) in order to prevent the formation of metal and organic residues on the bottom electrode 210.

Processing then continues with the deposition of the dielectric layer and the top electrode. The dielectric layer (e.g. BST having a thickness of around 10 to 60 nm, but preferably 30 nm) is preferably deposited by chemical vapor deposition (CVD) under oxidizing conditions, but can alternatively be deposited by sputtering. The top electrode having a thickness of 20 to 100 nm, but preferably 50 nm, is preferably deposited using RF magnetron sputtering at 400 degrees C, but can alternatively be deposited by e-beam evaporation at 300 degrees C.

Second Hardmask Embodiment: Silicon Oxynitride

In a contemplated alternative embodiment, silicon oxynitride can be used instead of silicon nitride for the hardmask material.

Third Hardmask Embodiment: Silicon-Rich Nitride

In another contemplated alternative embodiment, off-stoichiometric silicon nitride can be used instead of Si3N4 for the hardmask material. Compositions for this embodiment include SiNx where 0.5<x<1.34.

Fourth Hardmask Embodiment: Oxide/Nitride Stack

In a predicted alternative embodiment, a stack consisting of alternating layers of oxide and nitride, with one of the layers of nitride contacting the bottom electrode material, can be used as the hardmask material in order to promote adhesion of the electrode material to the hardmask and to prevent the formation of polymer residues during the etching of the bottom electrode.

Fifth Hardmask Embodiment: Silicon-Rich Oxide

In another predicted alternative embodiment, a stack of stoichiometric oxide (e.g. SiO2) over a silicon-rich oxide (e.g. SiO1.5) can be used instead of silicon nitride as the hardmask layer. The silicon-rich oxide can be deposited from SiH4 and oxygen sources using a plasma enhanced CVD process. In experimental tests, it was found that the adhesion after deposition was better for films deposited with SiH4/O2 ratios greater than or equal to 1.0. After several processing steps, including photolithography, dry etching of the silicon-rich oxide, dry etching of the platinum, and dry etching of the photoresist and the silicon-rich oxide, with several H2O clean up steps, including a spin rinse dry step, the silicon-rich oxide showed no sign of peeling from the platinum.

First Bottom Electrode Embodiment: Platinum

The bottom electrode is preferably formed from platinum, which is one of the noble metals. However, platinum does not adhere well to silicon dioxide, and therefore, a hardmask layer using silicon nitride must be used to etch the bottom electrode material to form the adjacent capacitor plates.

The following table summarizes and compares the processing conditions and adhesion data for platinum films deposited onto various substrates. It should be noted that "SC1" is a standard cleanup solution (NH4OH/H2O2/H2O), used in the common "RCA" cleanup process. Also, the "H2O" column in the table below shows an optional rinse.

|  |  |  |  | Post Pt Debond (psi) | | |
| --- | --- | --- | --- | --- | --- | --- |
| Substrate | Cleanup | Anneal | H2O? | Mean | Min | Max |
| Thermal SiO2 | none |  |  | 802 | 150 | 1910 |
| Thermal SiO2 | SC1 |  |  | 854 | 450 | 2310 |
| Thermal SiO2 | HF/SC1 |  |  | 567 | 176 | 904 |
| Thermal SiO2 | none |  | yes | 213 | 58 | 474 |
| Thermal SiO2 | SC1 |  | yes | 435 | 284 | 855 |
| Thermal SiO2 | HF/SC1 |  | yes | 500 | 191 | 735 |
| Thermal SiO2 | none | O2 |  | 802 | 0 | 41 |
| Thermal SiO2 | none | O2 | yes | 0 | 0 | 0 |
| LPCVD Si3N4 | none |  |  | 1145 | 759 | 1920 |
| LPCVD Si3N4 | SC1 |  |  | 1475 | 354 | 2290 |
| LPCVD Si3N4 | HF/SC1 |  |  | 1826 | 813 | 2620 |
| LPCVD Si3N4 | none | N2 |  | 1002 | 479 | 1400 |
| PECVD Si3N4 | none |  |  | 1868 | 852 | 2610 |
| PECVD Si3N4 | SC1 |  |  | 2170 | 1391 | 2860 |
| PECVD Si3N4 | HF/SC1 |  |  | 2394 | 1440 | 3100 |
| PECVD Si3N4 | none | N2 |  | 36 | 0 | 93 |
| HDP SiO2 | none |  |  | 0 | 0 | 0 |
| HDP SiO2 | SC1 |  |  | 0 | 0 | 0 |
| HDP SiO2 | HF/SC1 |  |  | 0 | 0 | 0 |
| HDP SiO2 | none | O2 |  | 0 | 0 | 0 |
| HDP SiO2 | none | O2 | yes | 0 | 0 | 0 |

The above table illustrates results from adhesion tests for platinum over various dielectric materials. (Adhesion for dielectric-over-metal structures are generally higher.) These results show that adhesion of nitrides to noble metals (e.g. platinum) is generally superior to that for any of the oxides tested, and overwhelmingly superior to that for CVD oxide. Furthermore, peeling of oxide films on platinum was observed (shown by the presence of 0's in the Debond columns).

The results further indicate that PECVD nitride appears to be slightly superior to LPCVD nitride. However, LPCVD nitride appears to be more durable to subsequent annealing than PECVD nitride. Furthermore, although PECVD nitride tends to be not as smooth as LPCVD nitride, PECVD nitride has the advantage that the composition does not have to be strictly stoichiometric. It has also been experimentally confirmed that PECVD nitride adheres well to underlying platinum.

The following data gives actual results obtained using sample embodiments of the present invention. The platinum etching was performed using a low pressure high density plasma reactive ion etch tool. Typical etch tools of this type are magnetically enhanced to allow the applied electromagnetic field to be absorbed by the gas to form a plasma. The particular tool used was a electron cyclotron resonance plasma using a 2.45 GHz microwave source. The ECR plasma is generated approximately 15 inches away from the chuck which has RF (13.56 MHz) power applied to it. The chuck was actively cooled using a clamp and He on the backside of wafer.

| Platinum Etch | |
| --- | --- |
| Cl2 Source Flow: | 50 sccm |
| Pressure: | 1.0 m/Torr |
| Chuck Temperature: | 30 degrees C |
| He Backside Pressure: | 10 Torr |
| ECR Power: | 1500 W |
| RF Power: | 900 W |
| Pt Etch Rate: | 150 nm/min |

Alternatively, for this particular equipment, the ECR power can range between 500–1500 W and the RF power can range between 100–1000 W. Similarly, gas flows and pressures between 20–80 sccm and 0.4–10 mTorr can be used with this tool. Other tools can have larger power supplies, different RF sources (plasma and chuck), and larger pumps and gas flows. In addition, alternative gas chemistries can be used (e.g. BCl3, HCl, SCl3, SF6, CxFy, Ar, Kr, Ne, He, Xe, O2, N2, and N2O).

Additional information on etching noble metals is found, e.g., in Shoji et at., "A 7.03 micron$^2$ Vcc/2-plate nonvolatile DRAM cell with a Pt/PZT/Pt/TiN capacitor patterned by one-mask dry etching," 1996 SYMPOSIUM ON VLSI TECHNOLOGY DIGEST 28 (1996); Nishikawa et al., "Platinum etching and plasma characteristics in RF magnetron and electron cyclotron resonance plasmas," 32 JAPANESE J. APPLIED PHYSICS PART 1 6102 (1993); and Harada et al., "N-InAlAs/InGaAs HEMT DCFL inverter fabricated using Pt-based gate and photochemical dry etching," E75-C IEICE TRANSACTIONS ON ELECTRONICS 1165 (1992); Mace et al., "Reactive ion etching of Pt/PZT/Pt ferroelectric thin film capacitors in high density DECR plasma," 29 Microelectronic Engineering 45 (1995); Voshchenkov, "Plasma etching processes for gigahertz silicon integrated circuits II," 2 INTERNATIONAL J. HIGH SPEED ELECTRONICS 45 (1991); all of which are hereby incorporated by reference.

Second Bottom Electrode Embodiment: Ruthenium

In a contemplated alternative embodiment, the electrode structure can be fabricated using a sputtered layer of ruthenium instead of platinum. Ruthenium, unlike platinum, forms a conductive oxide upon exposure to oxidizing conditions, and hence the electrode etch may have to remove some conductive oxide as well as the metal itself. Additionally, ruthenium oxide can be used as the electrode material when it is deposited over a thin layer of ruthenium (e.g. 50 to 100 nm), which serves as an oxidation barrier. Moreover, ruthenium is easier to etch than most other noble metals.

However, if the electrode material comprises ruthenium, a lower deposition temperature must be used during the subsequent dielectric deposition to prevent the oxidation of ruthenium, as the formation of ruthenium oxide over the ruthenium electrode increases the surface roughness and therefore increases the leakage current. Ruthenium also has the disadvantage of forming the volatile RuO4, which is highly toxic and reactive.

Otherwise this embodiment is similar to the platinum embodiment given above. For other processing details, see Yamamichi et al., "An ECR MOCVD (Ba,Sr)TiO3 Based Stacked Capacitor Technology with RuO2/Ru/TiN/TiSix Storage Nodes for Gbit-scale DRAMs," 1995 IEDM 119; and Yuuki et al., "Novel Stacked Capacitor Technology for 1 Gbit DRAMs with CVD-(Ba,Sr)TiO3 Thin Films on a Thick Storage Node of Ru," 1995 IEDM 115; both of which are hereby incorporated by reference.

Third Bottom Electrode Embodiment: Iridium

Iridium can also be used as the bottom electrode material, and provides many advantages over platinum. Iridium, unlike platinum, has the advantage of lacking any naturally occurring radioactive isotopes that would generate alpha particles. In addition, iridium adheres better to SiO2 than platinum, and therefore iridium provides more adhesion to the interlevel dielectric layer than does platinum. The leakage current density for iridium is slightly higher than that for platinum (due to the lower work function of iridium), but still within acceptable levels for gigabit DRAMs. Otherwise this embodiment is similar to the platinum embodiment given above. For other processing details, see Chen et al., "Ir-Electroded BST Thin Film Capacitors for 1 Giga-bit DRAM Application," 1996 IEDM 679, which is hereby incorporated by reference.

Fourth Bottom Electrode Embodiment: Palladium

Alternatively, the electrode structure can potentially be fabricated using a sputtered layer of palladium instead of platinum. Otherwise this embodiment is similar to the platinum embodiment given above.

Fifth Bottom Electrode Embodiment: Osmium

In another contemplated alternative embodiment, the electrode structure can be fabricated using a sputtered layer of osmium instead of platinum. However, this embodiment has the particular disadvantage that osmium compounds (especially osmium tetraoxide) are extremely toxic. Otherwise this embodiment is similar to the platinum embodiment given above.

Sixth Bottom Electrode Embodiment: Rhodium

In a predicted alternative embodiment, the electrode structure can be fabricated using a sputtered layer of rhodium instead of platinum. Otherwise this embodiment is similar to the platinum embodiment given above.

First Top Electrode Embodiment: Platinum

In one embodiment, the top electrode can be formed from platinum, which is one of the noble metals.

Second Top Electrode Embodiment: Ruthenium

In another embodiment, the top electrode can be formed from ruthenium, which is one of the noble metals.

Third Top Electrode Embodiment: Iridium

In another embodiment, the top electrode can be formed from iridium, which is one of the noble metals.

Fourth Top Electrode Embodiment: Palladium

In another embodiment, the top electrode can be formed from palladium, which is one of the noble metals.

Fifth Top Electrode Embodiment: Osmium

In another embodiment, the top electrode can be formed from osmium, which is one of the noble metals.

Sixth Top Electrode Embodiment: Rhodium

In another embodiment, the top electrode can be formed from rhodium, which is one of the noble metals.

First Hardmask Deposition Embodiment: PECVD Si3N4

The hardmask layer of silicon nitride is preferably deposited using a plasma enhanced chemical vapor deposition (PECVD) process without annealing.

Second Hardmask Deposition Embodiment: LPCVD Si3N4

Alternatively, the hardmask layer of silicon nitride can be deposited using a low pressure chemical vapor deposition (LPCVD) process. LPCVD Si3N4 has the advantage of promoting good adhesion even after annealing.

Third Hardmask Embodiment: Jet Vapor Si3N4 Deposition

In an alternative embodiment, Jet Vapor Deposition can be used to deposit the hardmask silicon nitride layer.

Fourth Hardmask Deposition Embodiment: Reactive Sputter

In another alternative embodiment, the hardmask layer of silicon nitride can be deposited using a reactive sputtering deposition process in a nitrogen atmosphere.

First Platinum Etch Chemistry Embodiment: Cl2

In one embodiment, the platinum bottom electrode can be formed by etching the platinum in desired locations using a Cl2 source with a flow rate of approximately 50 sccm. The etch rate of platinum under these conditions is around 90 nm/min. Furthermore, the etch rate of SiO2 under these conditions is around 100 nm/min.

Second Platinum Etch Chemistry Embodiment: Cl2/O2

In a preferred embodiment, the platinum is etched using 25 sccm O2 and 25 sccm of Cl2. Under these conditions, the platinum etch rate decreases to approximately 60 nm/min. In addition, by adding oxygen to the etch chemistry, the formation of metal and organic residues on the bottom electrode material is prevented. Furthermore, the silicon nitride hardmask is oxidation resistant, and therefore the oxygen source can be added to the etch chemistry without damaging the hardmask.

Third Platinum Etch Chemistry Embodiment: Cl2/20 percent O2

In an alternative embodiment, the bottom electrode can be formed by adding more than 20 percent oxygen to the Cl2 etch chemistry, with no more than 50 sccm total used during the etch. The addition of the oxygen reduces the formation of metal and organic polymers on the bottom electrode material (e.g. platinum) during the etch without damaging the hardmask material (e.g. SiNx).

Fourth Platinum Etch Chemistry Embodiment: Cl2/Ar

Alternatively, 25 sccm of Cl2 and 25 sccm of argon can be used to etch the bottom electrode material.

Fifth Platinum Etch Chemistry Embodiment: Cl2/Ar/O2

Alternatively, a combination of Cl2, Ar, and O2, with no more than 50 sccm total, can be used to etch the bottom electrode material.

According to a disclosed class of innovative embodiments, there is provided: a method of etching a metal layer, comprising the steps of: (a.) depositing an adherent hardmask layer comprising at least a layer consisting essentially at least 30 percent atomic of silicon and 30 percent atomic of nitrogen over a noble metal layer; (b.) etching said hardmask layer in a pattern; and (c.) etching said noble metal layer in said pattern, using said hardmask layer.

According to another disclosed class of innovative embodiments, there is provided: a method of fabricating a memory device capacitor structure, comprising the steps of: (a.) depositing a noble metal layer over an interlevel dielectric layer; (b.) depositing an adherent hardmask layer, comprising at least a layer consisting essentially of silicon and nitrogen, over said noble metal layer without any intervening adhesion layer; (c.) patterning and etching said hardmask layer to form openings therein, using a patterned photoresist layer; (d.) removing said photoresist layer; (e.) etching said metal layer through said openings, using a dry etch process which also erodes said hardmask; and (e.) removing said hardmask layer.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Of course, the specific etch chemistries, layer compositions, and layer thicknesses given are merely illustrative, and do not by any means delimit the scope of the claimed inventions.

Furthermore, a variety of diffusion barrier materials (e.g. TiN, WN, TiSiN, WSiN, TaN, TaSiN, TiWN, CrN, and CrAlN) can be substituted for the example given (e.g. TiAlN), and in some embodiments the diffusion barrier layer can even be omitted.

The disclosed inventions are also useful with other high-k dielectrics, e.g. SBT (strontium bismuth tantalate) or PLZT (lead lanthanum zirconium titanate). High-k dielectrics typically achieve a dielectric constant on the order of 500, which is much higher than the values otherwise achievable (e.g. about 50 for TiO2 or about 25 for tantalum pentoxide).

The invention can also be adapted to other combinations of dielectric materials in the interlevel dielectric. Furthermore, the hardmask material can have a graded composition of nitride and oxide instead of the Si3N4 of the presently preferred embodiment.

It should be noted that inert alloys of noble metals can be used as the bottom electrode material, in which the noble metals singly or in combination comprise at least 25 percent atomic of the material. In addition, the bottom electrode can consist of alternative metals, such as gold or rhenium.

What is claimed is:

1. A method of fabricating an electronic device formed over a semiconductor substrate, said method comprising the steps of:

forming a metal layer comprised of a noble metal over a surface of the substrate;

forming a hardmask layer on said metal layer, said hardmask layer comprised of a compound of silicon and nitrogen;

patterning and etching said hardmask layer so as to remove selected portions of said hardmask layer to expose a portion of said metal layer;

removing said exposed portion of said metal layer, leaving a remaining portion of said metal layer under a remaining portion of said hardmask layer;

removing the remaining portion of said hardmask layer; and then forming a dielectric layer, having a dielectric constant of at least about 500 in direct contact with a top surface of the remaining portion of said metal layer.

2. The method of claim 1, wherein said metal layer consists essentially of platinum.

3. The method of claim 1, wherein said hardmask layer is silicon nitride.

4. The method of claim 1, wherein said hardmask layer is silicon oxynitride.

5. The method of claim 1, wherein said hardmask layer is a layered structure in which some layers do not contain nitrogen.

6. The method of claim 1, wherein said hardmask layer is deposited using a plasma enhanced chemical vapor deposition process.

7. The method of claim 1, wherein said hardmask layer is deposited using a low pressure chemical vapor deposition process.

8. The method of claim 1, wherein the step of removing the exposed portion of said metal layer comprises ion bombardment from a source flow that includes an oxygen source and also an inert gas.

9. The method of claim 1, wherein the dielectric layer consists essentially of a material selected from the group consisting of barium strontium titanate, lead zirconium titanate, strontium bismuth tantalate, and lead lanthanum zirconium titanate.

10. The method of claim 1, further comprising the step of:

forming a top electrode layer over the dielectric layer.

11. The method of claim 10, wherein the top electrode layer comprises a noble metal.

12. The method of claim 1, wherein the metal layer comprises an inert alloy of a noble metal.

* * * * *